United States Patent [19]
Liu et al.

[11] Patent Number: 6,016,114
[45] Date of Patent: Jan. 18, 2000

[54] APPARATUS AND METHOD OF FABRICATING MIXED SIGNAL INTERFACE IN GSM WIRELESS APPLICATION

[75] Inventors: Edward W. Liu, Sunnyvale; Qasim Rashid Shami, Fremont, both of Calif.

[73] Assignee: LSI Logic Corporation, Milpitas, Calif.

[21] Appl. No.: 08/840,946

[22] Filed: Apr. 21, 1997

[51] Int. Cl.[7] .................................................. H03M 3/00
[52] U.S. Cl. ......................................... 341/143; 375/278
[58] Field of Search ................... 341/110, 143; 375/278, 284, 285, 346, 349

[56] References Cited

U.S. PATENT DOCUMENTS

| | | | |
|---|---|---|---|
| 4,692,738 | 9/1987 | Suzuki | 341/110 |
| 4,739,189 | 4/1988 | Kellogg . | |
| 4,972,436 | 11/1990 | Halim et al. . | |
| 5,104,822 | 4/1992 | Butler . | |
| 5,135,883 | 8/1992 | Bae et al. . | |
| 5,206,788 | 4/1993 | Larson et al. . | |
| 5,208,594 | 5/1993 | Yamazaki | 341/143 |
| 5,220,483 | 6/1993 | Scott . | |
| 5,225,704 | 7/1993 | Wakamiya et al. . | |
| 5,546,458 | 8/1996 | Iwami . | |
| 5,548,474 | 8/1996 | Chen et al. . | |
| 5,576,925 | 11/1996 | Gorowitz et al. . | |
| 5,592,556 | 1/1997 | Schwed | 380/49 |
| 5,621,675 | 4/1997 | Linz et al. . | |
| 5,627,536 | 5/1997 | Ramirez . | |
| 5,684,315 | 11/1997 | Uchiyama et al. . | |
| 5,696,699 | 12/1997 | Nair | 375/232 |
| 5,724,653 | 3/1998 | Baker et al. | 455/296 |
| 5,754,601 | 5/1998 | Horng et al. . | |

FOREIGN PATENT DOCUMENTS 02047862 2/1990 Japan .

OTHER PUBLICATIONS

IBM Technical Disclosure Bulletin, vol. 17, No. 6, Nov. 1974, pp. 1569–1570.
IBM Technical Disclosure Bulletin, vol. 28, No. 9, Feb. 1986, pp. 3981–3982.
Motorola Application Report DSP56ADC16 pp. 1–39, PTO Date Jan. 9, 1992.

*Primary Examiner*—Howard L. Williams
*Attorney, Agent, or Firm*—Mitchell, Silberberg & Knupp LLP

[57] ABSTRACT

A analog-to-digital conversion apparatus and method for mobile communication devices are disclosed by the present invention. Because the conventional CMOS process does not allow for high order anti-aliasing circuits to be fabricated with digital circuits on the same chip, a new apparatus had to be developed to use low order anti-aliasing filters for the analog-to-digital conversion. The apparatus of the present invention includes a low order anti-aliasing circuit, a delta-sigma converter, and post-conversion filters. The post conversion filters include a decimation circuit, a droop correction filter, and an offset adjust circuit. In this implementation, a low order analog anti-aliasing filter can be used along with a delta-sigma converter and post-conversion filters to eliminate the need for high order analog anti-aliasing filters. Another aspect of the present invention is the duplication of the circuits to process the incoming signals. The duplicate circuit is fed a null signal to process the noise only. Then, the processed noise is subtracted from the processed signals, which contain the information plus noise, to obtain a noise free processed signal.

37 Claims, 2 Drawing Sheets

APPARATUS AND METHOD OF FABRICATING MIXED SIGNAL INTERFACE IN GSM WIRELESS APPLICATION

BACKGROUND OF THE INVENTION

1. Field of the Invention

The present invention generally relates to the art of processing electrical signals. In particular, the present invention relates to the art of processing analog and digital signals in wireless communcation systems.

2. Description of Related Art

Integrated circuits (ICs) having components to handle analog signals as well as digital signals are often referred to as mixed-signal integrated circuits (MSIC's). One example of an MSIC is an IC designed to convert incoming analog signals to digital signals to be further processed by digital circuits. These are usually referred to as analog to digital converter circuits or ADC's. The MSIC's are becoming increasingly important in the telecommunications industry because MSIC's offer lower power consumption and higher performance. However, utilization of MSIC's such as ADC's in mobile telecommunication systems have been impeded by technical difficulties.

First, the analog-to-digital conversion circuits require high order analog filters but fabrication of high order analog filters in a digital CMOS (Complementary Metal Oxide Semiconductor) fabrication process is, at minimum, not practical.

To convert analog signal to digital signals without losing the information contained in the analog signal, the analog signal must be sampled at a frequency which is, at least, twice the highest frequency of the analog signal to be preserved. This requirement is often referred to as the Nyquist criteria.

For example, audio signals typically range from 20 Hz to 22 KHz. Analog electrical signals representing audio signals are at the same 20 to 22 KHz. To convert the analog signals to digital signals, the sampling frequency, $F_s$, must be at least 22 KHz. ×2, or 44 KHz. Of course, if the input frequency is higher, as is the case with radio frequencies, then the sampling frequency must be higher.

Often, to ensure that none of the information of the analog signal is lost, the sampling frequency is set higher than the minimum required. As the sampling frequency increases, the fidelity of the digital data to the analog data increases, thus better preserving the information contained in the analog signal. This also means that the analog to digital conversion is less susceptible to high frequency noise in the analog signal.

On the other hand, the increase in the sampling frequency means that the ADC becomes more complex, operates at higher temperature, consumes more power to handled the increased frequency requirements, and produces additional digital signal output. In addition, the increase in the digital signal output forces the digital circuits to increase in complexity. As a compromise between the competing requirements, often, the sampling frequency is often set at 270 KHz.

Therefore, the tendency in conventional ADC design has been to lower the sampling frequency, and reduce the susceptibility of the ADC to the high frequency noise using a high order analog filter. The high order analog filter is positioned to remove the high frequency noise in the incoming analog signal before being processed by the ADC. This technique is referred to as anti-aliasing, and the analog filter is referred to as the anti-aliasing filter (AAF).

In a wireless mobile communications environment using MSIC's, a basedband receiver requires a SINAD (signal to noise and distortion ratio) value of 59 dB at a sampling rate of 270K samples per second. These are the values prescribed by the industry standard specification for GSM (Global System for Mobile Communications), a worldwide digital cellular standard. At the same time, the required adjacent channel interference (ACI) rejection is at 80 dB/decade with cut-off at 100 KHz. For an ADC in this environment, a fourth order analog filter followed by a 10 bit ADC is conventionally used.

However, the implementation of a fourth order analog filter in a standard digital CMOS process is not feasible because the standard digital CMOS fabrication process does not allow for non-silicide polysilicon resistors. And, without the non-silicide polysilicon resistors, capacitors with adequate capacitance per unit area required to build fourth order analog filters cannot be built.

Second, analog circuits are adversely affected by the relatively noisy digital circuits. Digital circuits, especially the larger digital circuits prevalent in the industry, are very noisy relative to typical analog circuits. The analog circuits surrounding digital circuits may fail due to the noise generated by the digital circuits.

Moreover, increasing miniaturization of electronic devices, especially in the communications market, has required IC chips to become even more tightly integrated. Consequently, the circuits comprising the IC chips, both digital and analog, are being fabricated ever closer to each other, thereby aggravating the negative effects of the noise.

Previous attempts to alleviate the problem focused on the method of shielding or isolating the circuits from each other. For example, the U.S. Pat. No. 4,628,343, entitled "Semiconductor Integrated Circuit Device Free From Mutual Interference Between Circuit Blocks Formed Therein," issued to Yuji Komatsu, discloses an IC where "the first and second circuit blocks are shielded electrically from each other on the surface of the semiconductor chip." [Col. 2 ll. 27–30, the Komatsu reference.] In the U.S. Pat. No. 5,453, 713, entitled "Noise-Free Islands in Digital Integrated Circuits," issued to Hamid Partovi and Andrew J. Barber, the "integrated circuit chip has both digital and analog circuit functions, with one or more islands for isolating the analog functions from noise caused by the digital functions." [Abstract, the Partovi and Barber reference.] However, in tightly integrated, compact IC packages, shielding or isolation techniques may not be desirable, sufficient, or even feasible.

SUMMARY OF THE INVENTION

Therefore, an object of the present invention is to eliminate the adverse effect of the noise generated by the digital circuits on the analog circuits.

The present invention discloses an integrated circuit having a first, a second, and a third circuit and a first subtractor and a second subtractor. The first, the second, and the third circuits process analog signals and produce analog or digital outputs depending on the design. Because they are proximally located to each other, and because they are identically designed circuits, the circuits react identically to the environmental noise.

Using this design, the first and the third circuits are fed the I (the in-phase component) of a PSK (phase-shift-key) signal and Q (the quadrature component) of the PSK signal while the second circuit is fed a null signal, which may be zero volts. The null signal is defined as any signal which will cause the second circuit to produce, as its output, the processed version of the environmental noise only. Note that the first circuit will produce the processed version of the incoming I signal plus the processed version of the noise. Likewise, the third circuit will produce the processed version of the incoming Q signal plus the processed version of the noise.

Then, the output of the second circuit (which is equal to the noise components of the output of the first circuit or the output of the third circuit) is subtracted from the output of the first and the third circuit and the third circuits by the first and the second subtractors, respectively.

If the outputs of the first, the second, and the third circuits are digital, the digital subtractors are used. If the outputs are analog, then analog subtractors are used.

Another object of the present invention is to overcome the limitations of the digital CMOS process by designing the baseband receiver without a fourth order analog anti-aliasing filter. Instead, a lower order anti-aliasing filter is implemented before digitizing the incoming signal using a fast delta-sigma converter. Then, a digital filter is used to filter the converted signal.

Also disclosed by the present invention is the method for converting analog signals to digital signals by filtering the analog signals using a lower order anti-aliasing filter, sampling the filtered signal using, a delta-sigma converter, and filtering the converted signal using digital filters.

These and other aspects, features, and advantages of the present invention will be apparent to those persons having ordinary skilled in the art to which the present invention relates from the foregoing description and the accompanying drawings.

DETAILED DESCRIPTION OF THE PREFERRED EMBODIMENT(S)

Figure 1:
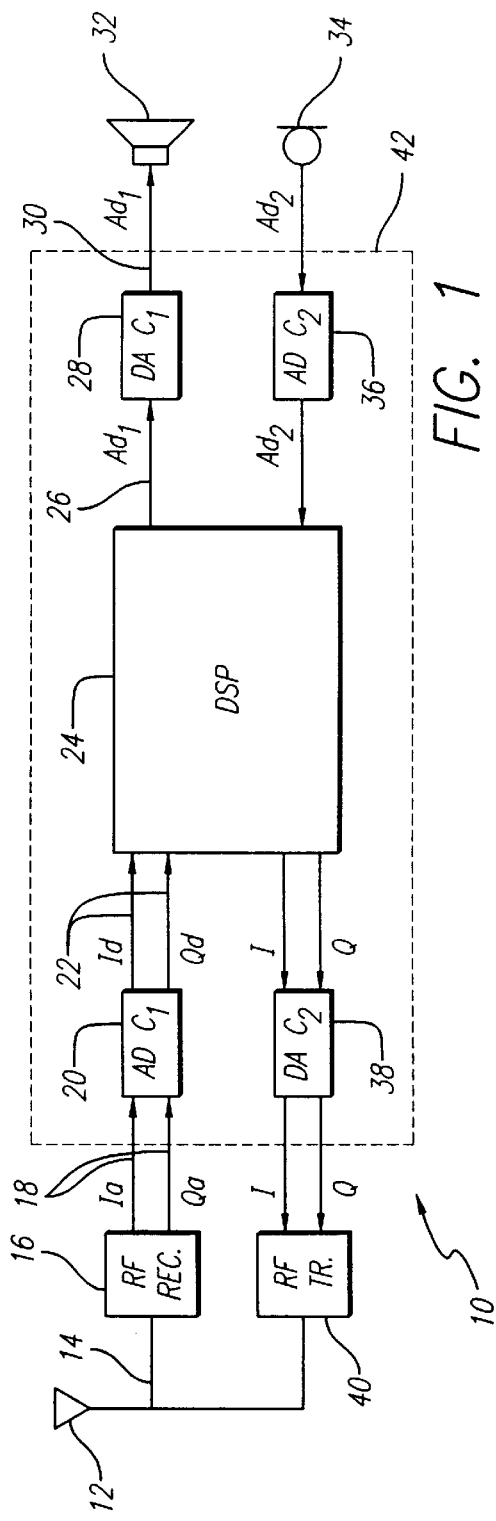
FIG. 1 is a simplified block diagram illustrating the major components of a GSM digital mobile unit.

Referring to FIG. 1, a simplified block diagram illustrating the major components of a GSM digital mobile unit 10 is illustrated. The GSM unit 10 operates as follows:

Telecommunications radio signals are received by the antennae 12 which is connected 14 to a RF (radio frequency) receiver 16. The RF receiver 16 separates the two components of the incoming signal into its I and Q components. The mobile channel signals for GSM are modulated using a phase-shift keying (PSK) technique. The modulation is performed by superimposing the information (in this case, audio signals) onto the carrier waves (at radio frequencies) using two orthogonal components I and Q where I is the in-phase component of the signal representing the information and Q is the quadrature component of the same signal. The use of the I and Q components of a PSK channel is well known in the art. Here, the incoming analog signal representing I will be referred to as $I_{a1}$, and the incoming analog signal representing Q will be referred to as $Q_{a1}$.

The $I_{a1}$ and the $Q_{a1}$ signals are passed 18 on to the analog-to-digital converter (ADC) 20 where the signals are converted into digital signals $I_{d1}$ and $Q_{d1}$, respectively. Here, the converted digital signal representing $I_{a1}$ will be referred to as $I_{d1}$, and the converted digital signal representing Q will be referred to as $Q_{d1}$.

The digitized signals $I_{d1}$ and $Q_{d1}$ are passed 22 to a digital signal processor (DSP) 24 where the digitized signals are selected, decoded, demodulated, and converted into another set of digitized signals, $A_{d1}$, representing the original audio signal. Then, the $A_{d1}$ is passed 26 to a digital-to-analog converter (audio-DAC) 28 where the $A_{d1}$ is converted into analog audio signal ($A_{a1}$). Finally, the $A_{a1}$ is passed 30 to a speaker 32 where the signal is converted into sound (mechanical audio signal), thus enabling the user of the mobile unit to hear the sound being sent by the sending unit.

To send or transmit sound, the processes is reversed. The sound is picked up by a microphone 34 and converted into an analog audio signal $A_{a2}$ which is passed to an analog-to-digital converter, (audio-ADC) 36. The audio-ADC converts the $A_{a2}$ to a digital signal $A_{d2}$ representing $A_{a2}$, and passes the $A_{d2}$ to the DSP 24. The DSP 24 codes, modulates, and separates the $A_{d2}$ into $I_{d2}$ and $Q_{d2}$ before sending it to a digital-to-analog converter (DAC) 38. Then, the DAC 38 converts the $I_{d2}$ and $Q_{d2}$ to analog signals $I_{a2}$ and $Q_{a2}$ to be transmitted by the RF Transmitter 40 using the antennae 12.

To increase performance and to minimize power consumption by the circuits, it is desirable to fabricate the major components of the GSM unit 10 on a single semiconductor device, or a chip. Contents of such a chip is illustrated by reference number 42 of FIG. 1. The components of the chip include the DSP and the converter circuits ADC 20, DAC 38, audio-DAC 28, and audio-ADC 36 with some of the components requiring both analog and digital circuitry. Because most of the components of the chip require digital circuitry, the chip is typically fabricated using a CMOS (Complementary Metal Oxide Semiconductor) digital circuit fabrication process.

Figure 2:
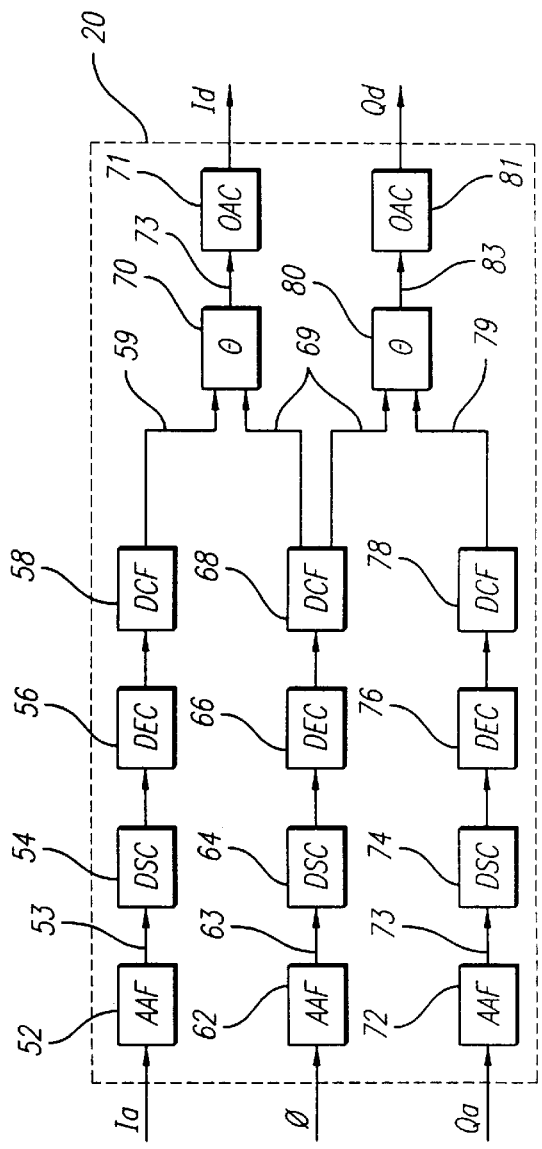
FIG. 2 is a block diagram illustrating a preferred embodiment of the present invention.
Figure 3:
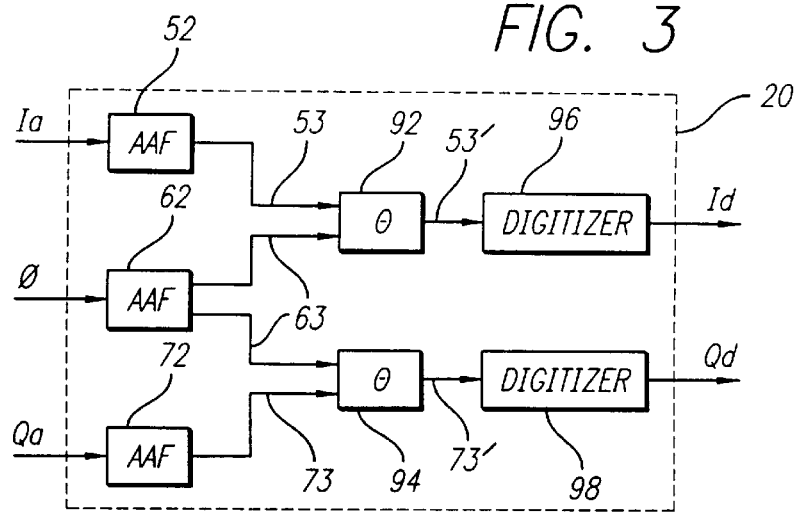
FIG. 3 is a block diagram illustrating an alternative embodiment of the present invention.

However, as discussed in the Background section above, fabrication of analog circuitry using a CMOS fabrication process poses noise problems. In addition, high order analog filters, required for the implementation of GSM ADC's, cannot be fabricated using the CMOS process. The present invention overcomes both of these hurdles with novel designs of the ADC as illustrated by FIGS. 2 and 3. Without overcoming these hurdles, all of the circuitry required for the chip could not have been fabricated on a single semiconductor device.

Referring now to FIG. 2, a preferred embodiment of the ADC 20 of FIG. 1 is illustrated in detail. A first anti-aliasing analog filter, AAF 52, takes the in-phase component, $I_a$, of the incoming analog signal. As already discussed, an ADC in this environment requires a fourth order analog filter. However, in the present invention, a lower order AAF is used. In particular, the AAF 52 may be a first order or a second order Sallen-Key type analog filter.

The filtered analog signal is then passed to a delta-sigma converter (DSC) 54. A high dynamic range DSC is selected to reduce the anti-aliasing requirement for the AAF 52. The DSC 54 samples the incoming analog signal at a very fast rate, thereby reducing the requirement that the analog signal be highly filtered prior to the sampling process. Because the DSC 54 oversamples the incoming analog signal, the cut-off frequency of the analog filter AAF 52 can be very high. So, a simple one-pole filter suffices for the AAF 52.

Once the analog signal is sampled and quantized by the DSC 54, the resulting signal can be filtered using a digital filter, DEC 56. The output of the DSC 54 are digital samples of the analog signal at 26 million samples per second. The digital samples are decimated by the decimation filter DEC 56. The decimation filter is a third order comb filter with the following transfer functions:

$$H(z)=((1-z^{}3)/(1-z^{}4))^{**}3$$

Alternatively, a fourth order comb filter can be used if the DSC 54 is a 10 bit converter.

The comb filter of the decimation filter 56 is implemented as a cascade of three accumulators, followed by a 1-in-48 sampler and 3 subtractors, and finally a 1-in-2 sampler. Together, the components of the decimation filter 56 operate to decimate the incoming 26 million samples per second to produce 270 thousand samples per second. This is a reduction factor of 96.

The decimation of the signal by the decimation filter 56 causes the signal to droop at 100 KHz. The droop correction filter, DCF, 58 corrects for the droop at 100 KHz caused by the decimation filter and produces the droop corrected signal. The output 59 of the DCF 58 is the anti-aliased, digitized, filtered, and corrected version of the input signal $I_a$.

Likewise, the input signal $Q_a$ is anti-aliased by the AAF 72, digitized by the DSC 74, filtered by the decimator DEC 76, and corrected by the DCF 78. The DCF 78 produces the output 79 which is the processed version of the quadrature input $Q_a$.

Similarly, a null input, $\phi$, is processed by the anti-aliasing filter AAF 62, digitized by the DSC 64, filtered by the decimator DEC 66, and corrected by the DCF 68. The DCF 68 produces the output 69 which is the processed version of the null input. The output 69 of the null input is used for noise cancellation of the outputs 59 and 79 as explained below.

In the ADC 20, the circuits processing the $I_a$, $\phi$, and the $Q_a$ signals have identical designs. That is, the AAF 52 is identical to the AAF 62 and to the AAF 72, the DSC 54 is identical to the DSC 64 and to the DSC 74, the DEC 56 is identical to the DEC 66 and to the DEC 76, and the DCF 58 is identical to the DCF 68 and to the DCF 76.

A majority of the circuits comprising the ADC 20 are digital circuits which are very noisy compared to analog circuits. Because the AAF 52 is an analog circuit processing analog signal $I_a$, AAF 52 is adversely affected by the noise generated by the digital circuits of the ADC 20 and produces an output 53 which is a function of the input plus noise. The output 53 of the AAF 52 can be expressed as:

$$S_{53}=F_{52}(I_a)+N_{52}$$

where $S_{53}$ is the signal at 53

$F_{52}(I_a)$ is the function of the AAF 52 operating on the input signal $I_a$, and $N_{52}$ noise portion of the output $S_{53}$ Similarly, the signal at the output 73 of the AAF 72 can be expressed as:

$$S_{73}=F_{72}(Q_a)+N_{72}$$

Likewise, the signal at the output 63 of the AAF 62 can be expressed as:

$$S_{63}=F_{62}(\phi)+N_{62}$$

However, the $\phi$, or the null input, is selected to achieve the result that $F_{62}(\phi)=0$. Typically, $\phi$ is zero (0), but it can be any value or signal achieving the result of $F_{62}(\phi)=0$. Then, the signal at 63 becomes $$S_{63}=N_{62}$$

Because the circuits the AAF 52, the AAF 62, and the AAF 72 have identical designs, they perform identical functions to the input signal. Also, because the circuits the AAF 52, the AAF 62, and the AAF 72 are fabricated proximal to each other, they experience the same environmental noise. The identity of the functions and the noise responses can be expressed as:

$$F_{aaf}=F_{52}=F_{62}=F_{72},$$

and $$N=N_{52}=N_{62}=N_{72}$$

Then, the expressions describing the signals $S_{53}$, $S_{63}$, and $S_{73}$ become:

$$S_{53}=F_{faa}(I_a)+N$$

$$S_{63}=N$$

$$S_{73}=F_{faa}(Q_a)+N$$

Then, by subtracting the noise component from the signals $S_{53}$ and $S_{73}$, the noise effect of the digital circuits on the analog AAF circuits can be eliminated. The noise N can be eliminated by subtracting the $S_{63}$, the noise, from each of the signals $S_{53}$ and $S_{73}$ using an analog subtractor. This technique is illustrated by FIG. 3 and discussed below. However, in the preferred embodiment as illustrated by FIG. 2, the noise at $S_{63}$ is processed by the DSC 64, DEC 66, and DCF 68 before being subtracted from the similarly processed signals of $S_{53}$ and $S_{73}$.

The signals at the lines 59, 69, and 79, $S_{59}$, $S_{69}$, and $S_{79}$ respectively, can be expressed as $$S_{59}=F_{dcf}(F_{dec}(F_{dsc}(F_{aaf}(I_a))))+F_{dcf}(F_{dec}(F_{dsc}(N)))$$

$$S_{69}=F_{dcf}(F_{dec}(F_{dsc}(N)))$$

$$S_{79}=F_{dcf}(F_{dec}(F_{aaf}(Q_a))))+F_{dcf}(F_{dec}(F_{dsc}(N)))$$

where $F_{dcf}$=is the function of the DCF $F_{dec}$=is the function of the DEC $F_{dsc}$=is the function of the DSC $F_{aaf}$=is the function of the AAF Then, the digital subtractor 70 subtracts $S_{69}$ from $S_{59}$ to produce a noise free output 73. Similarly, the digital subtractor 80 subtracts $S_{69}$ from $S_{79}$ to produce a noise free output 83.

Figure 4A:
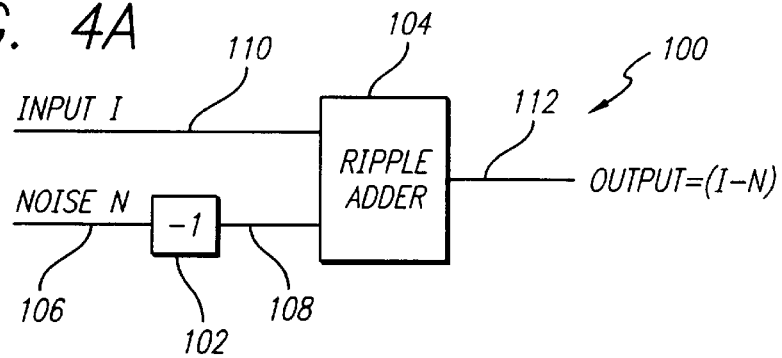
FIG. 4A is a block diagram illustrating a digital subtractor.

Digital subtractors are well known in the art, and FIG. 4A illustrates a simple digital subtractor 100. Referring to FIG. 4A, the noise 106 is negated by multiplying the value by −1 using a multiplier 102. The multiplier 102 is a very simple circuit to perform a 2's complement to the incoming signal, effectively flipping the incoming bits. Then, the negated noise 108 is added 104 to the input 110 to obtain an output 112 value which is the input value minus the noise value.

Referring again to FIG. 2, the noise free signals at 73 and 83, $S_{73}$ and $S_{83}$, respectively, are processed by offset adjust circuits, OAC, 71 and 81 before being forwarded to the DSP 24 of FIG. 1 for further processing.

Another embodiment of the present invention is illustrated by FIG. 3. Referring now to FIG. 3, the major components of the ADC 20 of FIGS. 1 and 3 is illustrated. Similar to the embodiment illustrated by FIG. 2, the in-phase component signal $I_a$, the quadrature component signal $Q_a$, and the null signal φ are filtered by the AAF's 52, 62, and 72. However, unlike the FIG. 2 embodiment, the noise represented by signal 63, $S_{63}$, is subtracted from the signals 53 and 73, $S_{53}$ and $S_{73}$, prior to being digitized.

Figure 4B:
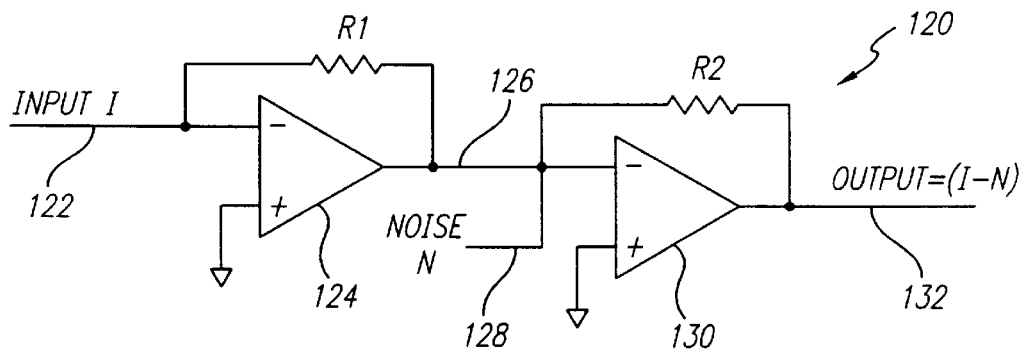
FIG. 4B is a block diagram illustrating an analog subtractor.

Analog subtractors 92 and 94 of FIG. 3 are well known in the art, and FIG. 4B illustrates a simple analog subtractor 120. Referring to FIG. 4B, the incoming signal 122, I or Q, is inverted by the Op. Amp. 124 to produce, as the output 126, the inverted signal, –I or –Q. The inverted signal is then added to the noise signal 128 and inverted again by the Op. Amp. 130. The final output 132 is the inversion of the result of –I+N or –Q+N. Expressed mathematically, $$S_{132} = -(-I+N) = I - N, \text{ or } = -(-Q+N) = Q - N$$

Referring again to FIG. 3, the noise canceled analog signals 53' and 73' are passed to the digitizers 96 and 98, respectively. Here, the digitizer 96 represents the combination of the DSC 54, the DEC 56, the DCF 58, and the OAC 71 of FIG. 2. Likewise, the digitizer 98 represents the combination of the DSC 74, the DEC 76, the DCF 78, and the OAC 81 of FIG. 2.

In summary, the ADC of a GSM system comprises a lower level anti-aliasing analog filter which is fabricated on the same semiconductor device as the digital circuits of the ADC. After using a fast DSC to quantize the incoming analog signal, a digital filter system is applied to the quantized signal. This novel design allows the use of robust digital filters plus a lower level analog filters to replace a costly high level analog anti-aliasing filter.

In addition, to eliminate or minimize the adverse effects of the noisy digital circuits on the analog circuits of the device, a duplicate circuit is used to process the noise signal only. Then, the noise signal is subtracted from the signals carrying the information, leaving noise free information signals.

Although the present invention has been described in detail with regarding the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶6.

What is claimed is:

1. An integrated circuit comprising:
   a first circuit for processing a first analog signal and producing a first digital output;
   a second circuit for processing a second analog signal and producing a second digital output;
   a third circuit for processing a third analog signal and producing a third digital output;
   a first digital subtractor circuit, connected to said first circuit and connected to said second circuit, to subtract said second digital output from said first digital output; and
   a second digital subtractor circuit, connected to said third circuit and connected to said second circuit, to subtract said second digital output from said third digital output.

2. An integrated circuit according to claim 1 wherein said first circuit comprises:
   an anti-aliasing filter to filter said first analog signal; and
   a delta-sigma converter connected to said anti-aliasing filter for quantizing the filtered signal.

3. An integrated circuit according to claim 2 further comprising:
   a decimation filter, connected to said delta-sigma convert, to further reduce the quantized signal; and
   a droop correction filter, connected to said decimation filter, to correct the droop.

4. An integrated circuit according to claim 3 wherein said decimation filter is a third order comb filter with the following transfer function:

$H(z)=((1-z^{}3)/(1-z^{}4))^{**}3$.

5. An integrated circuit according to claim 4 wherein said comb filter further comprises:
   a cascade of three accumulators;
   a 1-in-48 sampler connected to said accumulators;
   three subtractors connected to said 1-in-48 sampler; and
   a 1-in-2 sampler connected to said subtractors.

6. An integrated circuit according to claim 2 wherein said anti-aliasing filter is a Sallen-Key type active filter.

7. An integrated circuit according to claim 2 wherein said anti-aliasing filter is a first order Sallen-Key type active filter.

8. An integrated circuit according to claim 2 wherein said anti-aliasing filter is a second order Sallen-Key type active filter.

9. An integrated circuit according to claim 1 wherein said first circuit, said second circuit, and said third circuit are identically designed circuits.

10. An integrated circuit according to claim 1 wherein said first circuit, said second circuit, said third circuit, said first digital subtractor circuit, and said second digital subtractor circuit are fabricated on a single semiconductor device.

11. An integrated circuit according to claim 1 wherein said third signal is a quadrature component of said first signal.

12. An integrated circuit according to claim 1 wherein said second signal is a null signal.

13. An integrated circuit according to claim 1 wherein said second signal is zero.

14. An integrated circuit according to claim 1 wherein said first digital subtractor further comprises:
   a multiplier used to negate said second output; and
   a ripple adder, connected to said multiplier, to add said first output to said negated second output.

15. An integrated circuit comprising:
   a first circuit for processing a first analog signal and producing a first output;
   a second circuit for processing a second analog signal and producing a second output;
   a third circuit for processing a third analog signal and producing a third output;
   a first analog subtractor circuit, connected to said first circuit and connected to said second circuit, to subtract said second output from said first output; and
   a second analog subtractor circuit, connected to said third circuit and connected to said second circuit, to subtract said second output from said third output.

16. An integrated circuit according to claim 15 wherein said first circuit is an anti-aliasing filter.

17. An integrated circuit according to claim 16 wherein said anti-aliasing filter is a Sallen-Key type active filter.

18. An integrated circuit according to claim 16 wherein said anti-aliasing filter is a first order Sallen-Key type active filter.

19. An integrated circuit according to claim 16 wherein said anti-aliasing filter is a second order Sallen-Key type active filter.

20. An integrated circuit according to claim 15 wherein said first circuit, said second circuit, and said third circuit are identically designed circuits.

21. An integrated circuit according to claim 15 wherein said first circuit, said second circuit, and said third circuit are proximally located to each other.

22. An integrated circuit according to claim 15 wherein said first circuit, said second circuit, said third circuit, said first subtractor circuit, and said second subtractor circuit are fabricated on a single semiconductor device.

23. An integrated circuit according to claim 15 wherein said third signal is a quadrature component of said first signal.

24. An integrated circuit according to claim 15 wherein said second signal is a null signal.

25. An integrated circuit according to claim 15 wherein said second signal is zero.

26. An integrated circuit according to claim 15 further comprising a delta-sigma converter.

27. An integrated circuit according to claim 15 further comprising a digital filter system.

28. An integrated circuit according to claim 27 wherein said digital filter system comprises:
    a delta-sigma converter for quantizing an input signal, so as to generate a quantized signal;
    a decimation filter, connected to said delta-sigma converter, to reduce the quantized signal; and
    a droop correction filter, connected to said decimation filter, to correct droop.

29. An integrated circuit according to claim 28 wherein said decimation filter is a third order comb filter with the following transfer function:

$$H(z) = ((1-z^{}3)/(1-z^{}4))^{**}3$$

30. An integrated circuit according to claim 29 wherein said comb filter further comprises:
    a cascade of three accumulators;
    a 1-in-48 sampler connected to said accumulators;
    three subtractors connected to said 1-in-48 sampler; and
    a 1-in-2 sampler connected to said subtractors.

31. A method for converting analog signals to digital signals, said method comprising:
    filtering an analog signal using a lower order anti-aliasing filter to produce a filtered signal;
    sampling said filtered signal using a delta-sigma converter to produce digital samples;
    digitally filtering said digital samples to produce a digital signal output;
    filtering a null input signal using a second lower order anti-aliasing filter to produce noise signal;
    sampling said noise signal using a delta-sigma converter to produce digital noise samples;
    digitally filtering said digital noise samples to produce a digital noise output; and
    subtracting said digital noise output from said digital signal output.

32. A method for interfacing analog telecommunications signals to digital signal according to claim 31 wherein said null signal is a zero signal.

33. A method for converting analog signals to digital signals, said method comprising:
    filtering an analog signal using a lower order anti-aliasing filter to produce a filtered signal;
    sampling said filtered signal using a delta-sigma converter to produce digital samples;
    digitally filtering said digital samples to produce a digital signal output;
    filtering a null input signal using a second lower order anti-aliasing filter to produce a noise signal; and
    subtracting said noise signal from said filtered signal prior to sampling said filtered signal.

34. A method for interfacing analog telecommunications signals to digital signal according to claim 33 wherein said null signal is a zero signal.

35. A single chip useful in wireless communications for receiving and transmitting radio signals, the semiconductor device comprising:
    an analog-to-digital converter (ADC) to convert incoming analog signal to digital signal;
    a digital signal processor (DSP), connected to said ADC, to code, decode, modulate, and demodulate the digital signal;
    an audio digital-to-analog converter (audio-DAC), connected to said DSP, to convert processed digital signal to audio analog signal;
    an audio analog-to-digital converter (audio-ADC), connected to said DSP, to convert audio analog signal to audio digital signal; and
    a digital-to-analog converter (DAC), connected to said DSP, to convert coded and modulated digital signal to analog signal suitable for transmission.

36. A chip according to claim 35 where said ADC comprises:
    an anti-aliasing filter (AAF) for filtering incoming analog signal;
    a delta-sigma converter (DSC), connected to said AAF, for quantizing the filtered signal;
    a decimation filter (DEC), connected to said DSC, to further reduce the quantized signal; and
    a droop correction filter, connected to said DEC, to correct the droop.

37. A chip according to claim 35 where said ADC comprises:
    a first circuit for processing a first analog signal and producing a first digital output;
    a second circuit for processing a second analog signal and producing a second digital output;
    a third circuit for processing a third analog signal and producing a third digital output;
    a first digital subtractor circuit, connected to said first circuit and connected to said second circuit, to subtract said second digital output from said first digital output; and
    a second digital subtractor circuit, connected to said third circuit and connected to said second circuit, to subtract said second digital output from said third digital output.

* * * * *